United States Patent [19]

Ward

[11] Patent Number: 4,733,776

[45] Date of Patent: Mar. 29, 1988

[54] PROTECTIVE DEVICE FOR REMOTE CONTROL UNIT

[76] Inventor: Keith Ward, 121 Cameron Way, San Francisco, Calif. 94124

[21] Appl. No.: 752,676

[22] Filed: Jul. 8, 1985

[51] Int. Cl.⁴ ............................................. B65D 85/38
[52] U.S. Cl. ................................. 206/305; 206/45.34; 206/523; 150/52 R
[58] Field of Search ...................... 206/523, 305, 45.34, 206/45.33, 45.32; 150/52 R; 383/86

[56] References Cited

U.S. PATENT DOCUMENTS

| | | | |
|---|---|---|---|
| 3,033,258 | 5/1962 | Pollard et al. | 150/52 J |
| 3,071,172 | 1/1963 | Mayer | 150/52 J |
| 3,473,590 | 10/1969 | Rohlik | 150/52 J |
| 3,813,017 | 5/1974 | Pimsleur | 150/52 J |
| 3,835,905 | 9/1974 | Spruyt et al. | 150/52 J |
| 4,000,769 | 1/1977 | Katz | 150/52 J |
| 4,075,702 | 2/1978 | Davies | 206/305 |
| 4,158,230 | 6/1979 | Washizuka | 206/305 |
| 4,420,078 | 12/1983 | Belt et al. | 206/305 |
| 4,421,150 | 12/1983 | Masters | 383/86 |

FOREIGN PATENT DOCUMENTS

| | | | |
|---|---|---|---|
| 120372 | 3/1954 | European Pat. Off. | 206/305 |
| 97807 | 7/1978 | France | 206/305 |

*Primary Examiner*—Joseph Man-Fu Moy
*Attorney, Agent, or Firm*—Howard Cohen

[57] ABSTRACT

A protective device for a remote control unit includes a resilient, deformable foam panel provided with an arcuate curvature about a central axis, in channel-like fashion. A flexible, transparent elastic member is adapted to extend across the channel opening, with a remote control device disposed within the channel opening. Hook or loop fastener patches are secured to opposed edges of the transparent member and are engageable with like loop or hook fastener patches secured to the outer peripheral surface of the foam panel, so that the transparent member applies tension to the opposed sides of the channel opening and frictionally retains the remote control unit therein. The elasticity of the transparent member permits operation of the pushbuttons of the remote unit, while the foam material cushions the unit and prevents damage from casual impact or falling. Further hook and loop patches may be joined to the outer surface to secure the remote control unit to a table surface or a remote, childproof location.

2 Claims, 6 Drawing Figures

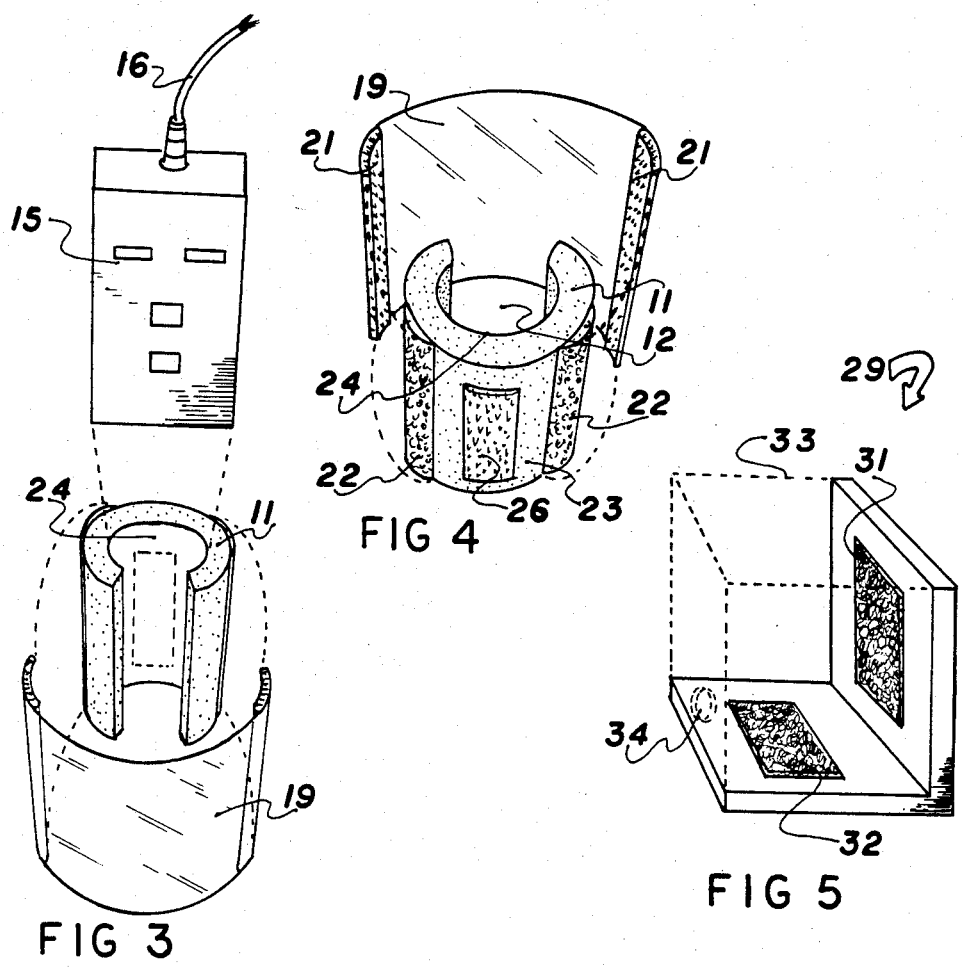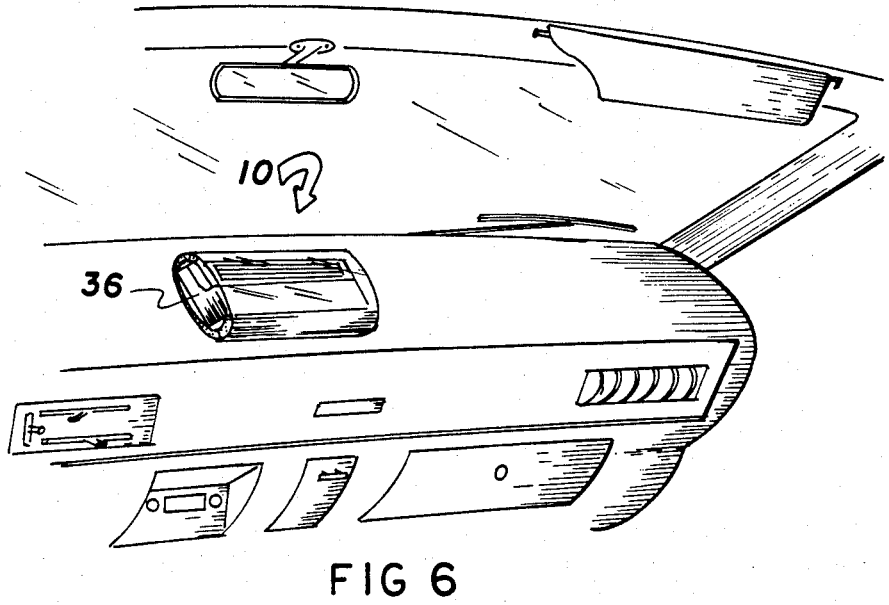

PROTECTIVE DEVICE FOR REMOTE CONTROL UNIT

BACKGROUND OF THE INVENTION

In recent years a significant trend in consumer entertainment electronics has been the addition of remote control devices. For such items as photographs, televisions, video tape recorders, compact disc digital audio players, and the like, remote control provides far greater convenience and ease of operation. Especially with regard to audio and video entertainment products, it is generally true that the devices must be located same distance from the viewer or listener, for best results, and that it is not possible to operate the equipment directly from the viewing or listening location. Remote control devices have obviated the need for the consumer to repeatedly get up and move from the favored listening or viewing spot to adjust the electronic devices.

This factor may be most evident with regard to video tape recorders. Viewers frequently wish to record programming direct from broadcast, but do not want to include the advertisements commonly associated with the broadcast. Using a remote control unit with a pause control, it is possible to edit out all the commercial announcements while making the recording, resulting in an excellent program recordng which is free of commercial interruptions.

Modern remote control devices, whether cable connected or wireless connected to the electronic unit, generally comprise a rectangular unit dimensioned to be hand held and including a plurality of pushbutton controls. They usually include an outer housing of high impact plastic to resist damage. However, due to the fact that such devices are hand held, they are necessarily small, and easily overlooked. The high impact plastic is generally smooth and slippery, with the unfortunate, frequent result that the unit is accidentally knocked from the table or chair arm where it usually resides. Although remote control devices will withstand occasional impacts, many are damaged by repeated accidental impacts.

Remote control devices are also a major attractant for young children, due primarily to the fact that the devices provide action at a distance, and that they achieve dramatic results with little or no effort. Thus remote control units are often the object of children's games, and are easily broken during such games.

Most remote control devices provide many different functions, and actually include rather sophisticated electronics, often embodying modulators, microprocessors, rf transmitters, switch arrays, and the like. Thus, replacement of such devices is often a substantial expense, ranging from $40 to as much as $200.

SUMMARY OF THE PRESENT INVENTION

The present invention generally comprises a protective device for remote control units which is adapted to prevent damage and breakage of such units. A salient feature of the invention is that it protects the remote unit while permitting free use of the unit. Another important feature is that the invention provides a convenient means for securing the remote control unit out of reach of children, thus eliminating a major source of damage of remote controls.

The protective device for a remote control unit includes a resilient, deformable foam panel provided with an arcuate curvature about a central axis, in channel-like fashion. The invention also includes a flexible, transparent elastic member which is adapted to extend across the channel opening, with the remote control device disposed within the channel opening. Hook or loop fastener patches are secured to opposed edges of the transparent member and are engageable with like loop or hook fastener patches secured in spaced apart fashion to the outer peripheral surface of the foam panel, so that the transparent members applies tension to the opposed sides of the channel opening and frictioning retains the remote control unit therein.

The elasticity of the transparent member permits visualization and operation of the pushbuttons of the remote unit directly through the transparent member, while the foam material cushions the unit and prevents damage from casual impact or falling. The hook and loop closures are adjustable to accommodate remote control units of varying sizes, so that one size of protective device is adapted to be used with many different devices.

Further hook and loop patches may be joined to the outer surface to secure the remote control unit to a table surface or wall surface, so that the remote control cannot be accidentally bumped and damaged in a fall. Thus the invention not only cushions any accidental fall or impact, but also aids in preventing such occurrences.

Furthermore, the further hook and loop patches may be used to secure the remote control unit in a remote location which is inaccessible to children. For example, the unit may be adhered to an upper wall or door location which children cannot reach, so that a major cause of damage to remote control units is virtually eliminated.

BRIEF DESCRIPTION OF THE DRAWING

FIG. 3 is an exploded view of the protective device assembly with a remote control device.

FIG. 4 is an exploded rear view of the protective device of the present invention.

FIG. 5 is a perspective view of a further embodiment of the protective device of the present invention.

FIG. 6 is another embodiment of the protective device of the present invention.

DESCRIPTION OF THE PREFERRED EMBODIMENT

Figure 1:
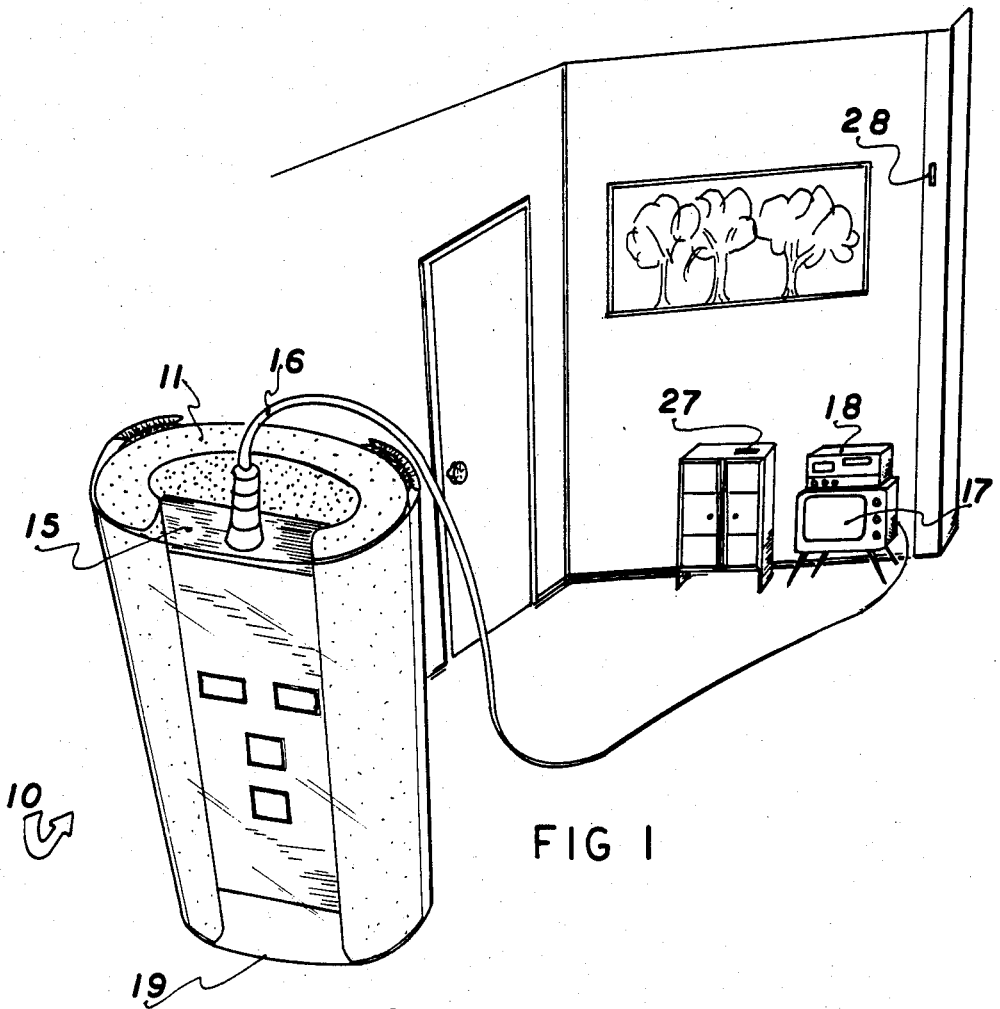
FIG. 1 is a perspective view of the protective device of the present invention, shown in use with a remote video control unit.

The present invention generally comprises a protective device for cushioning, protecting, and securing from harm a small electronic device or the like. Although the preferred embodiment will be described with reference to a remote control unit for a home entertainment system such as a television video tape recorder, compact disc player, laser disc video player, or the like, the invention is not limited to such use.

With regard to FIGS. 1-4, the invention includes a housing member 11 formed of resilient, shock absorbing material such as expanded foam plastic or the like. The housing 11 has the configuration of a panel provided with arcuate curvature about a central, with the opposed edges of the panel disposed in confronting, spaced apart relationship. The panel thus describes a channel-like configuration, with a channel cavity 12 formed therein and a channel opening 13 extending longitudinally parallel to the central axis. The cavity 12 is adapted to receive an electronic device such as a remote control unit 15 therein. It may be noted that the ends of the channel cavity 12 are open, so that the cable connecting the remote control unit to an electronic system such as a television 17 or a VCR 18 may extend unimpeded therefrom. For those remote control units which rely on wireless communication with the console unit, the open end of the cavity permits wireless communication without interference.

The invention also includes a web member 19 adapted to extend across and close the channel opening 13. The laterally opposed edges are provided with fastener means such as hook or loop fabric fastener patches 21 extending longitudinally therealong. Complementary loop or hook patches 22 extend longitudinally in spaced apart fashion along the outer peripheral surface 23 of the housing, to secure the web member 19 thereto. The portion of the web member 19 which extends across the opening 13 is transparent, and the entire web may be made of transparent material for ease of manufacture. Furthermore, the web 19 is formed of flexible, deformable, and relatively elastic material, such as any of the suitable polymer film materials known in the prior art.

The panel which forms the housing 11 is also deformable, so that the cavity 12 may be expanded to receive devices of varying size and configuration. The web 30 member is joined to the housing under slight tension to draw the confronting edges thereof together and compressively engage the device 15. The edges of the device 15 are thus gripped by the inner surface 24 in a secure frictional engagement which prevents accidental or intentional removal of the device 15 unless the web member 19 is first released from the housing 11.

Due to the transparency of the web member 19, the invention provides direct visualization of the indicia and control buttons on the face 25 of the remote control unit 15. Furthermore, the elasticity and flexibility of the web permits actuation of the control buttons by manual pressure applied directly through the web member 19. Thus the present invention surrounds and insulates from shock every surface of the unit 15, yet full functional operation of the unit 15 is retained. Therefore, damage due to accidental falls and casual impact is virtually eliminated, resulting in great savings over the average operating lifetime of the system being controlled.

Figure 2:
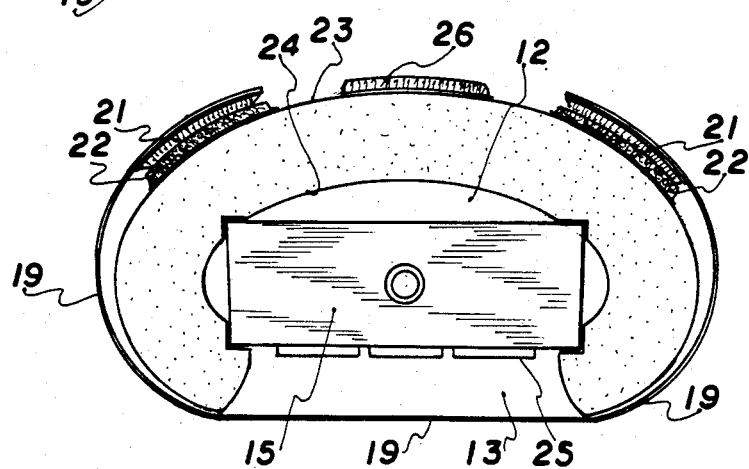
FIG. 2 is an end view of the protective device of the present invention assembled with a remote control device.

The present invention further protects the unit therein by providing means to store the device 15 in a location removed from harm's way. With reference to FIGS. 2 and 4, a further fabric fastener patch 26 is secured to the outer surface 23 between the fastener patches 21. A complementary fabric fastener patch 27 or 28 (FIG. 1) is secured to the surface of a relatively fixed structure, such as a furniture article or a door frame, respectively. When the unit 15 is not in use, the patch 26 may be used to adhere the assembly to the patches 27 or 28, thus storing the assembly in a location in which casual impact or accidental falls are not likely to occur. Furthermore, such locations may be unreachable by small children, thereby preventing unauthorized playing with the remote control unit and obviating a significant cause of damage to such control devices. Another complementary fastener patch may be self-adhered to a location adjacent to a favored viewing or listening location, so that the assembly of the present invention may be secured thereto as a routine matter. This expident will further prevent accidental damage to the unit 15, such as that caused by inadvertently knocking the unit from a table to the floor.

With regard to FIG. 5, a further embodiment of the present invention includes a right angle bracket assembly 29 adapted to be secured to a vertical wall surface or the like. The interior surfaces of the bracket assembly are provided with fabric fastener patches 31 and 32 which are complementary to the patch 26 on the housing 11. A cover 33 is removably secured to the bracket assembly, so that the protective device and the remote control unit may be secured to the fastener 31 or 32 and enclosed by the cover 33. A lock 34 actuated by key or combination may be provided to more surely prevent unauthorized use of the unit 15 by children and other individuals.

It may be appreciated that the present invention may be used in realms beyond the home entertainment industry. For example, as shown in FIG. 6, a typical garage door opening system known in the prior art is usually provided with a remote actuating unit 36 intended to be carried in a vehicle. This unit is often subject to damage by dropping to the floor of the vehicle, and is frequently misplaced and not readily available when needed. In accordance with the invention, the remote actuating unit 36 is secured within the housing 11 of the invention, as described previously, and the assembly is secured to the dash portion of the vehicle, using the fastener pitch 26 and a complementary patch self-adhered to the dash surface. The invention provides cushioning to absorb road shock, and also provides a convenient means for maintaining the control unit within easy reach of the vehicle operator.

Although the invention has been described with reference to remote control or actuating devices, it is intended that its use not be limited to such devices. Any relatively small, fragile item of value may be protected by the present invention, including hand held calculators, personal radios and cassette tape players, LCD television receivers, and the like.

I claim:

1. A protective device for an electronic apparatus having pressure responsive, manually actuatable controls, comprising; a housing assembly incuding a continuous curved sidewall defining a cavity therein dimensioned to receive the apparatus, said sidewall formed of resilient, shock absorbing material and dimensioned to substantially circumscribe and enclose the apparatus; means for enabling manual access to and manipulation of the controls portion of the apparatus directly through a closed portion of the housing assembly, including an opening extending from the cavity to the exterior of said housing and adapted to be disposed in general registration with the controls portion of the apparatus, a transparent web member adapted to be secured across said opening, means for releasably securing said web member across said opening, said web member being formed of elastic, deformable material sufficiently pliable to permit manual impingement on the controls portion of the electronic apparatus directly through said web member to effect actuation of the controls portion thereby.

2. A protective device for an electronic control apparatus having a control panel responsive to manual pressure, including; a housing assembly, said housing assembly including a curved, continuous sidewall member formed of resilient, shock absorbing material, said curved sidewall defining a longitudinally extending, open-ended sleeve adapted to substantially circumscribe the apparatus; a slot opening formed in said sidewall and extending longitudinally therein; means for permitting visualization and actuation of the control panel of the apparatus, including a transparent web member adapted to be secured across said slot opening in general registration with the control panel of the apparatus; and means for releasably securing said web member across said opening under tension to draw together the opposed sides of said slot opening to contract said sleeve and compressively engage and retain the apparatus within the housing assembly, said transparent web member formed of resilient, elastic material to transmit manual pressure directly therethrough to effect actuation of the control panel of said apparatus when said web member is secured across said opening.

* * * * *